US00RE40075E

(19) United States
(12) Reissued Patent
Gillingham

(10) Patent Number: US RE40,075 E
(45) Date of Reissued Patent: *Feb. 19, 2008

(54) METHOD OF MULTI-LEVEL STORAGE IN DRAM AND APPARATUS THEREOF

(75) Inventor: Peter B. Gillingham, Kanata (CA)

(73) Assignee: MOSAID Technologies, Incorporated, Kanata, Ontario (CA)

( * ) Notice: This patent is subject to a terminal disclaimer.

(21) Appl. No.: 09/654,367

(22) Filed: Sep. 1, 2000

Related U.S. Patent Documents

Reissue of:
(64) Patent No.: 5,283,761
Issued: Feb. 1, 1994
Appl. No.: 07/916,673
Filed: Jul. 22, 1992

U.S. Applications:
(63) Continuation of application No. 08/595,020, filed on Jan. 31, 1996, now Pat. No. Re. 37,072.

(51) Int. Cl.
*G11C 11/56* (2006.01)

(52) U.S. Cl. ..... 365/168; 365/189.07; 365/189.09; 365/190; 365/149; 327/56; 327/52

(58) Field of Classification Search ..... 365/149, 365/168, 189.07, 189.09, 190; 327/56, 52
See application file for complete search history.

(56) References Cited

U.S. PATENT DOCUMENTS

| | | | | |
|---|---|---|---|---|
| 4,287,570 A | | 9/1981 | Stark | 365/104 |
| 4,415,992 A | | 11/1983 | Adlhoch | 365/94 |
| 4,622,655 A | | 11/1986 | Suzuki | 365/149 |
| 4,661,929 A | | 4/1987 | Aoki et al. | 365/149 |
| 4,771,404 A | | 9/1988 | Mano et al. | 365/189.07 |
| 5,184,324 A | | 2/1993 | Ohta | 365/149 |
| 5,283,761 A | * | 2/1994 | Gillingham | 365/189.07 |
| 5,293,563 A | | 3/1994 | Ohta | 365/190 |
| 5,532,955 A | * | 7/1996 | Gillingham | 365/149 |
| 5,612,912 A | * | 3/1997 | Gillingham | 365/168 |
| 5,903,511 A | * | 5/1999 | Gillingham | 365/230.06 |
| 5,933,366 A | * | 8/1999 | Yoshikawa | 365/185.03 |
| RE37,072 E | * | 2/2001 | Gillingham | 365/189.07 |

OTHER PUBLICATIONS

Ohta, Yoshiji, et al., Symposium, "A Novel Memory Cell Architecture for High–Density DRAMs," VLSI Circuits, May 1989, pp. 101–102.

* cited by examiner

*Primary Examiner*—Andrew Q. Tran
(74) *Attorney, Agent, or Firm*—Hamilton, Brook, Smith & Reynolds, P.C.

(57) ABSTRACT

A method of processing data having one of four voltage levels stored in a DRAM cell is comprised of sensing whether or not the data voltage is above or below a voltage level midway between a highest and a lowest of the four levels, setting the voltage on a reference line higher than the lowest and lower than the next highest of the four levels in the event the data voltage is below the midway voltage level, and setting the voltage on the reference line higher than the second highest and lower than the highest of the four levels in the event the data voltage is above the midway point, and sensing whether the data voltage is higher or lower than the reference line, whereby which of the four levels the data occupies is read.

10 Claims, 4 Drawing Sheets

Figure 1:
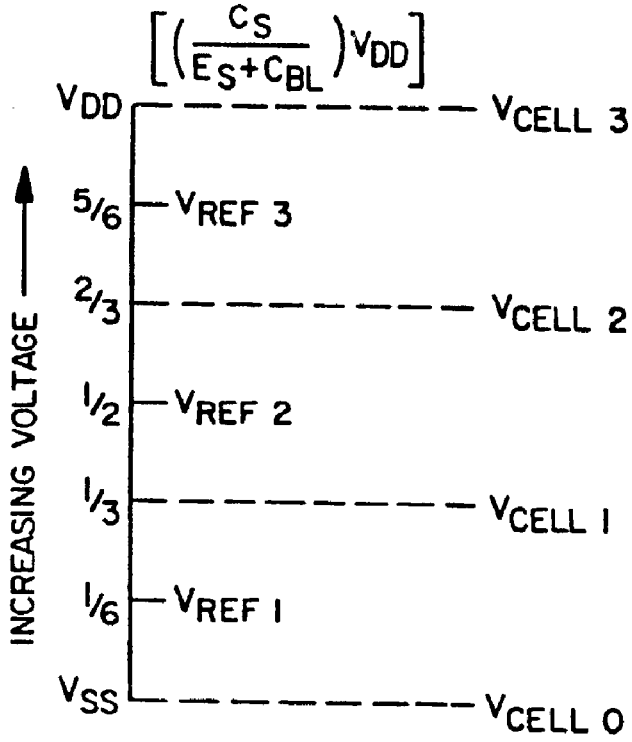

BITO
BL*A
VREF=VDD/2
VREF2
BL*B
BITI
BL*
SA
BL
BLA
BLB
VCELL2=[(VCELL-VDD/2) CS/(CS+CBL) + VDD/2]
CELL
VSS
13
11
15
VCELL2
0
1
DUMMY CELL
17
VREF3
18
DUMMY CELL
CELL

BL*A
BL*B
BLA
BLB
1
0
VCELL2
CELL
VSS
13
11
15
18
CCELL

METHOD OF MULTI-LEVEL STORAGE IN DRAM AND APPARATUS THEREOF

Matter enclosed in heavy brackets [ ] appears in the original patent but forms no part of this reissue specification; matter printed in italics indicates the additions made by reissue.

This is a continuation of Reissue Application Ser. No. 08/595,020, filed Jan. 31, 1996, which is based on original U.S. Pat. No. 5,283,761 issued Feb. 1, 1994.

FIELD OF THE INVENTION

This invention relates to dynamic random access memory (DRAM) memories, and in particular to a method of storing a variable level signal in each cell of a DRAM for representing more than one bit in each cell.

BACKGROUND TO THE INVENTION

To store for example two bits in a DRAM cell, it must be able to store four different voltage levels. A problem with such cells, is that noise margins are reduced to one-third that of a one bit per cell DRAM, which is too low to withstand the occasional α-particle hit.

A second problem with multi-bit storage cells relates to the method of sensing. No simple method of sensing has previously been designed, although attempts have been made to solve this problem, e.g. as described in the publication by M. Aoki et al, "A 16-Levels/Cell Dynamic Memory", ISSCC Dig. TECH. Papers 1985, pp 246-247, and in T. Furuyama et al, "An Experimental Two-Bit/Cell Storage DRAM for Macrocell or Memory-On-Application", IEEE Journal of Solid State Circuits, Vol. 24, No. 2, pp 388-393, April 1989. The technique described by Aoki cannot use normal sense amplifiers. It requires a precision analog D to A converter to implement a staircase waveform and a charge amplifier to sense data. The technique described by Furuyama requires the generation of precision reference levels to distinguish between four levels. These levels are not self-compensated for offsets developed in the sensing operation, and this method suffers from poor signal margin. Hidaka et al describe a technique for simultaneously reading two cells at a time in the article "A divided/Shared Bitline Sensing Scheme for 64Mb DRAM Core" in the 1990 Symposium on VLSI Circuitry 1990, IEEE, p. 15, 16 which while describing dividing a bitline, is not related to multiple bit storage in a single cell.

DRAMs have previously been built with cells holding up to sixteen bits of storage, e.g. in the aforenoted article by M. Aoki et al, for use in file memories. A 4 K test array is believed to have been the largest memory built using this design. Leakage characteristics of the DRAM cell were required to be very tightly controlled and even then, accurate sensing of the small voltage differences between levels becomes very difficult. Another problem with this scheme was the length of time required to access: a single read cycle required 16 clocks for the read followed by 16 clocks for the restore.

To implement a 2 bit DRAM, one can define the cell as storing one of four voltage levels $V_{cell0}$, $V_{cell1}$, $V_{cell2}$ and $V_{cell3}$, and reference voltage midpoints between these four voltage, which can be defined as $V_{ref1}$, $V_{ref2}$ and $V_{ref3}$. These midpoints can be referred to, to differentiate between the four voltage levels. The relative voltage of these levels are shown in Table 1 below.

| STORAGE VOLTAGES | REFERENCE VOLTAGES | ACTUAL VOLTAGE |
|---|---|---|
| $V_{cell1}$ | | $V_{DD}$ |
| | $V_{ref3}$ | $5/6\ V_{DD}$ |
| $V_{cell2}$ | | $2/3\ V_{DD}$ |
| | $V_{ref2}$ | $1/2\ V_{DD}$ |
| $V_{cell1}$ | | $1/3\ V_{DD}$ |
| | $V_{ref1}$ | $1/6\ V_{DD}$ |
| $V_{cell0}$ | | $V_{SS}$ |

The storage voltages are the actual voltages stored in the cells, although the sensing voltages are somewhat more attenuated. Since sensing takes place on the bitlines which divide cell charge by the cell to bitline capacitance ratio, much lower voltages than those in the cell are actually sensed. In a standard DRAM, these voltage differences are in the order of 100-300 mV. It is the voltage midpoints between these smaller signals that must finally be generated to allow for correct sensing.

Furuyama et al in the article noted above describes one method of sensing these voltages. Furuyama et al used three sense amplifiers and three approximate midpoint sensing voltages. The cell charge is shared with the bitline, the bitline is split into three sections (sub-bitlines) and three sense amplifiers determine whether the cell charge is above or below their particular reference voltages. This data is then converted to two bits and a resulting output. Reconversion of the two bits allows approximate values to be driven into the bitline so that restore takes place after the read cycle. A write cycle operates in the same way as the restore section of the read cycle.

It should be noted that since the cell shares charge with three sub-bitlines, and the reference cell with only one sub-bitline, the reference voltage is about three times larger than it should be for sensing, casting doubt on the operability of this design. Secondly, three sense amplifiers are used, and since sense amplifiers have been growing proportionally larger and larger with each generation of memory, a minimum of sense amplifiers is desirable. A third problem is that the reference voltage is stored on a cell whose leakage does not track the leakage of the data cells, introducing another source of error into the circuit.

SUMMARY OF THE PRESENT INVENTION

In the present invention a method and circuit has been designed which substantially solves the above-identified problems. Only two sense amplifiers are required, which generate the sensing voltages at the time of sensing. In the present invention each bitline is split exactly in half, rather than into thirds, by use of a switch. The noise margins are relatively large, equivalent to that of a standard DRAM maintaining reliability, and the present design can be used as a standard one bit per cell DRAM as an alternative to a multiple bit per cell DRAM, which increases its universality, allows it to be used in present designs, and increases yield.

In accordance with an embodiment of the present invention, a method of processing data having one of four levels stored in a DRAM cell is comprised of sensing whether or not the data voltage is above or below a voltage level midway between a highest and a lowest of the four levels, setting the voltage on a reference line higher than the lowest and lower than the next highest of the four levels in the event the data voltage is below the midway voltage level, setting the voltage on the reference line higher than the second highest and lower than the highest of the four levels in the event the data voltage is above the midway point, and sensing whether the data voltage is higher or lower in voltage than the reference line, whereby which of the four levels the data bit occupies is read.

In accordance with an embodiment of the present invention, a method of processing data having one of plural levels stored in a DRAM cell capacitor is comprised of dumping the charge of the cell capacitor on a first of a pair of conductors of a folded bitline, maintaining the other of the pair of conductors split into other sub-bitline conductors and charging each of the other sub-bitline conductors to an intermediate voltage, splitting the first of the conductors into first sub-bitline conductors, sensing the sub-bitlines to determine whether the charge of the cell has a higher voltage than the intermediate voltage of one of the other sub-bitline conductors and providing a logic level result signal, storing the logic level result signal in a dummy cell capacitor, setting a charge storage capacitor and all of the sub-bitlines other than the first sub-bitline maintaining a voltage resulting from the dumped charge to a predetermined voltage, dumping charge stored in the dummy cell capacitor on the sub-bitlines and charge storage capacitor, thereby varying the predetermined voltage stored thereon to a degree related to the capacities of the dummy cell capacitor, the charge storage cells and the predetermined voltage, to a level above or below the intermediate level, isolating the sub-bitlines, applying the intermediate voltage to one of the other sub-bitline conductors, comparing the cell voltage on one sub-bitline with the voltage on the other sub-bitline carrying the level above or below the intermediate level to obtain a first logic bit, and comparing the voltages carried by the other sub-bitlines to obtain a second logic bit, whereby the first and second logic bits are indicative of one of four logic states corresponding to one of the plural levels stored in the DRAM cell.

BRIEF INTRODUCTION TO THE DRAWINGS

Figure 2:
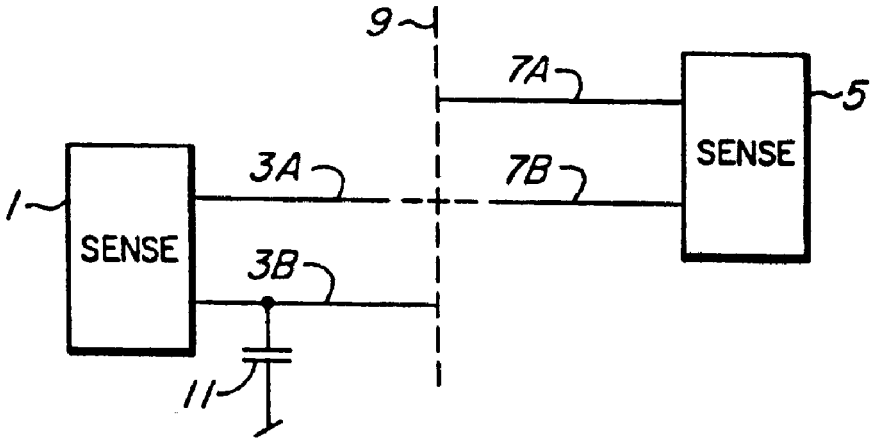
Figure 3:
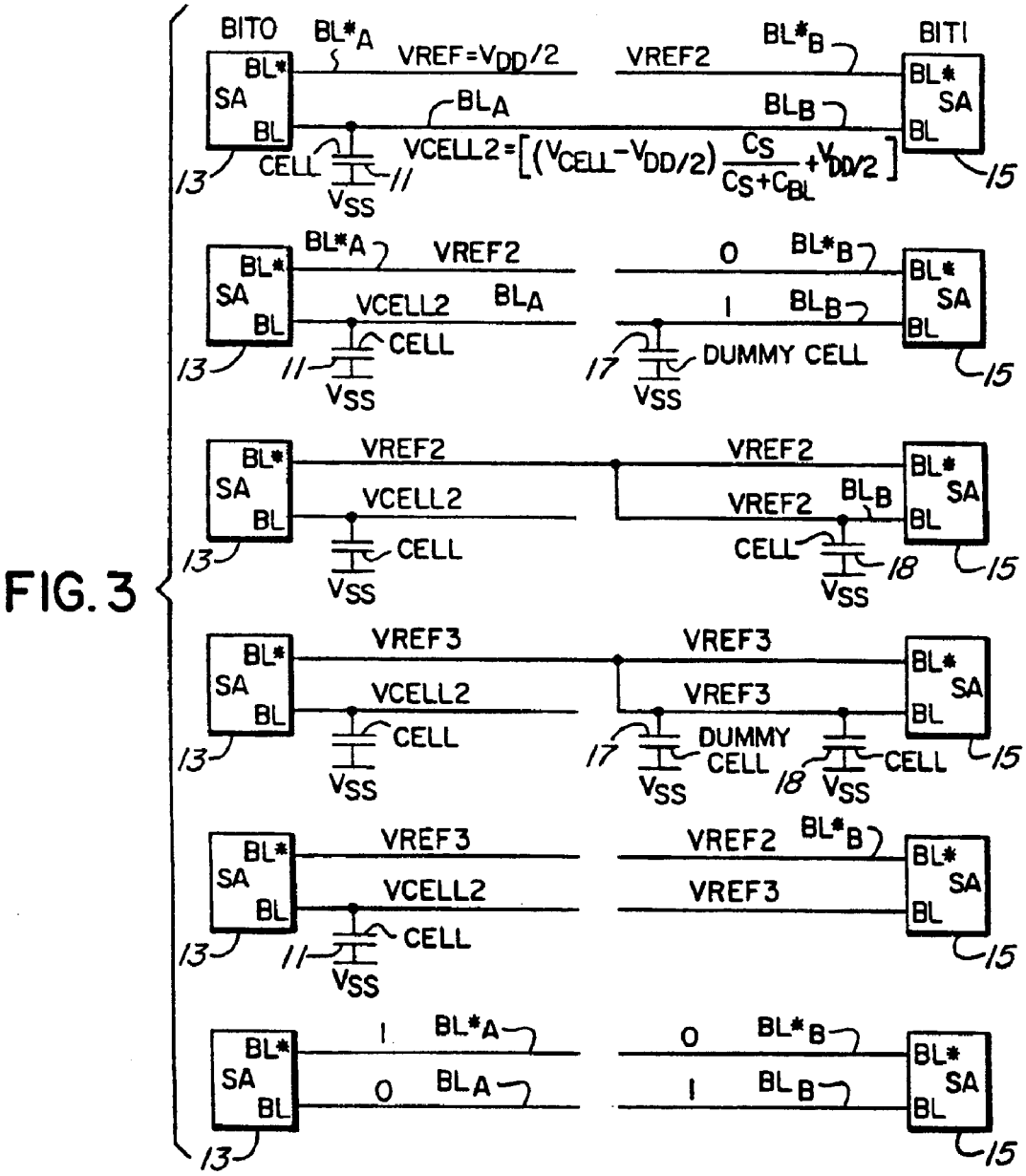
Figure 4:
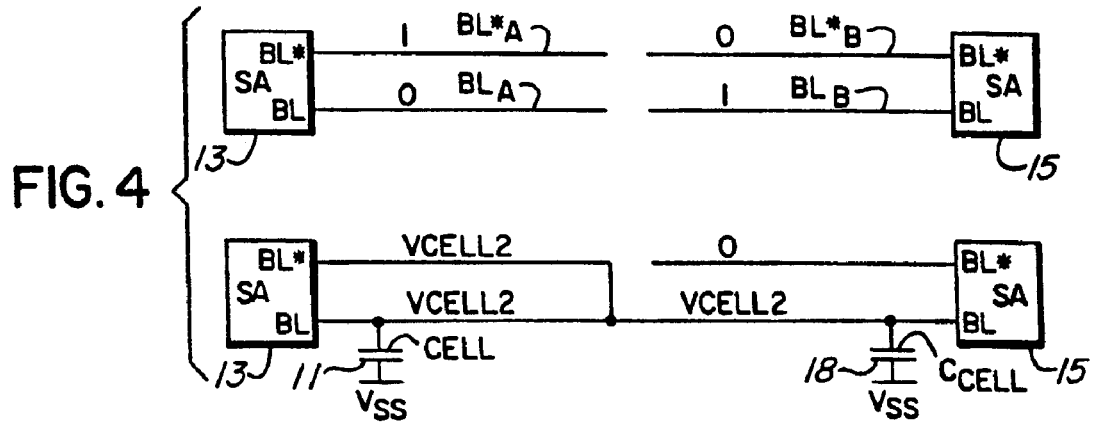
Figure 5:
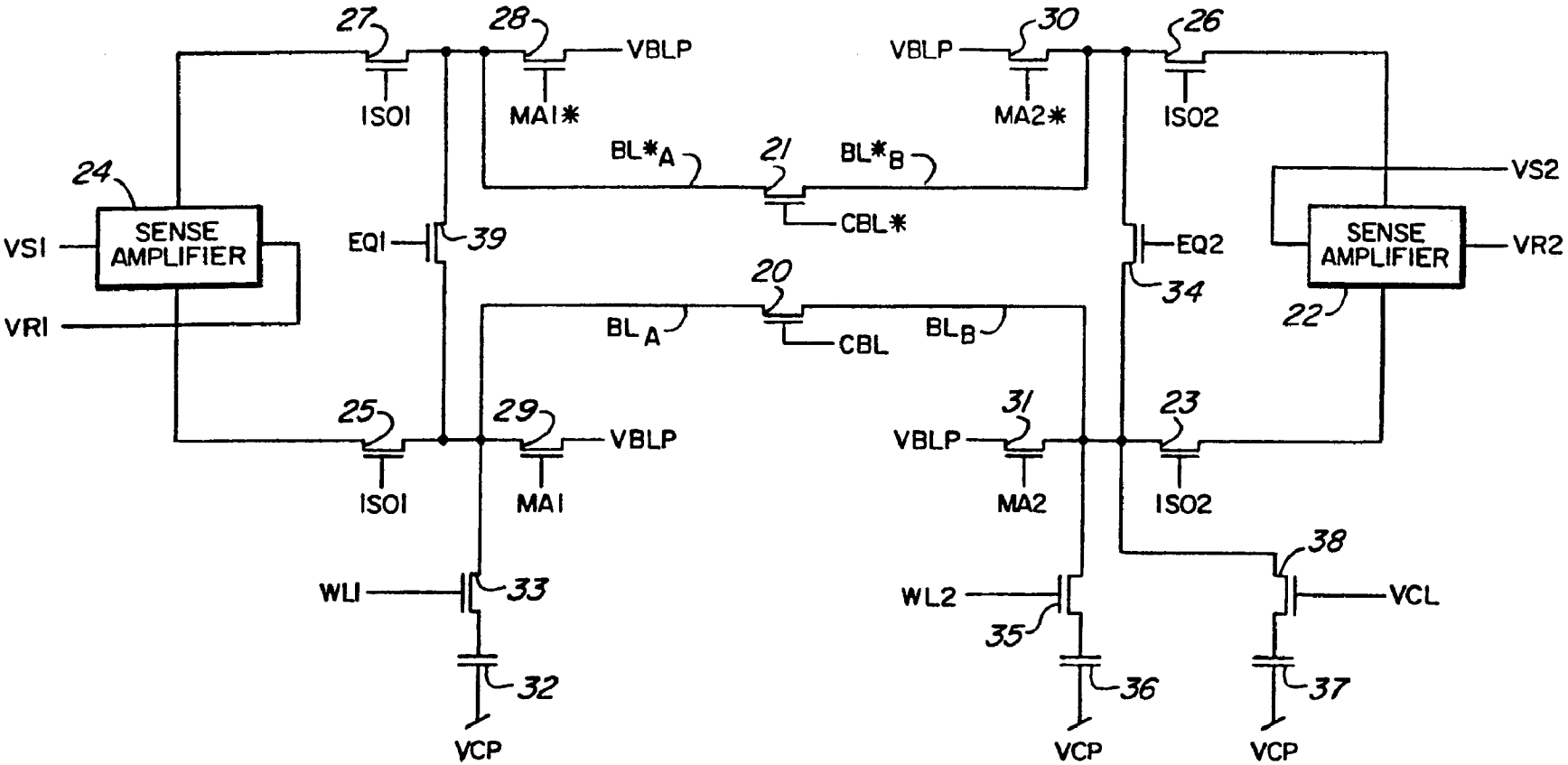
Figure 6:
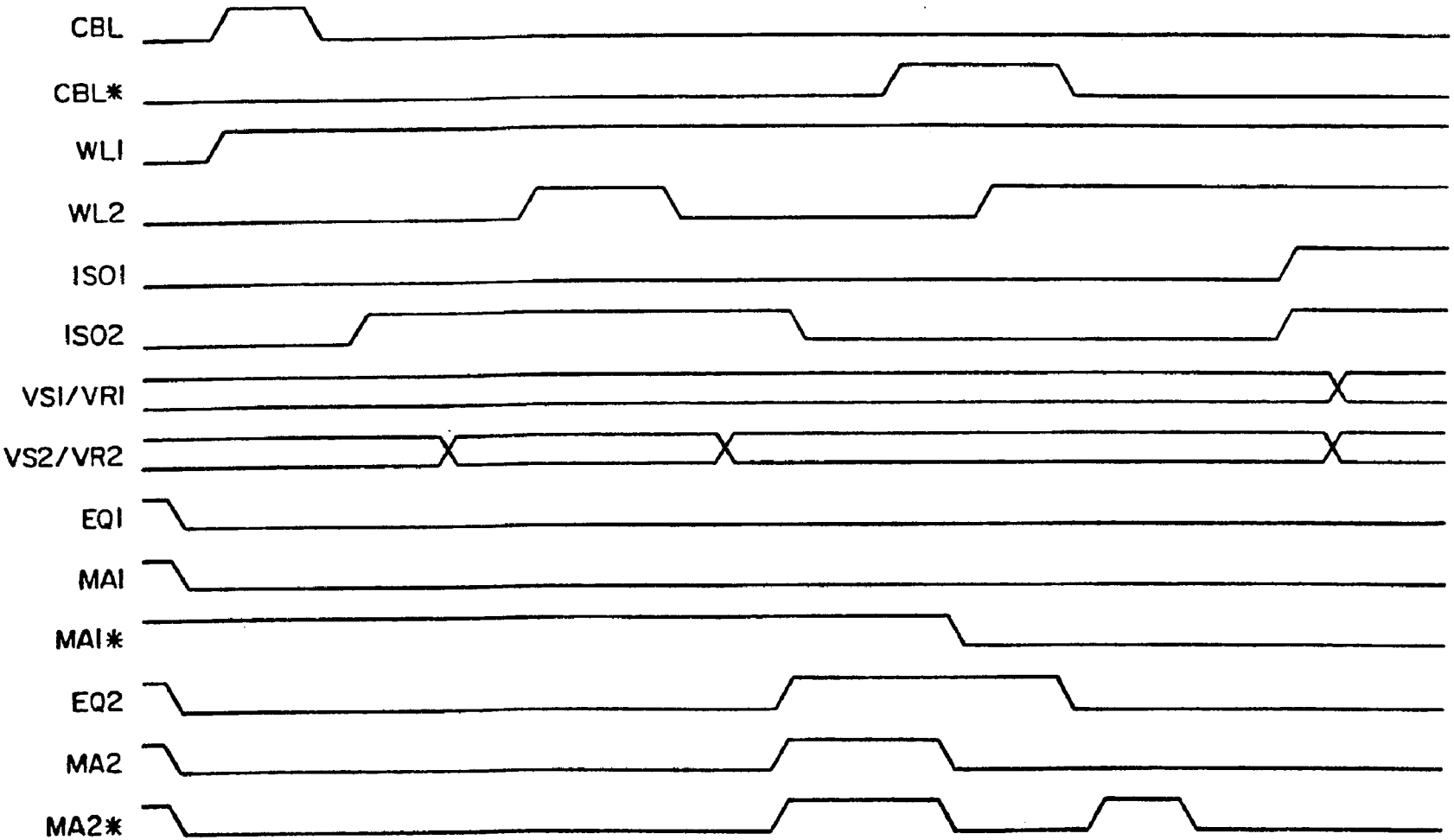

A better understanding of the invention will be obtained by reference to the detailed description below, in conjunction with the following drawings, in which:

FIG. 1 is a diagram illustrating various voltage levels referred to in the description, FIG. 2 is a block diagram used to illustrate the basic concepts of the invention, FIG. 3 illustrates a block diagram in six steps of a read cycle, FIG. 4 illustrates in block diagram two steps of a write or restore cycle, FIG. 5 is a schematic diagram illustrating an embodiment of the invention, and FIG. 6 illustrates a timing diagram of the schematic illustrated in FIG. 5.

DETAILED DESCRIPTION OF THE INVENTION

For a DRAM cell to store two bits using a single cell capacitor, the cell capacitor should store one of four voltage values $V_{cell0}$, $V_{cell1}$, $V_{cell2}$ or $V_{cell3}$, wherein $V_{cell0}$ represents the lowest and $V_{cell3}$ represents the highest cell voltage. To differentiate between the voltages, mid-point voltages $V_{ref1}$, $V_{ref2}$ and $V_{ref3}$ are defined, as shown in FIG. 1. It may be seen that if the lowest actual cell voltage $V_{cell0}$ is $V_{SS}$ or zero, $V_{ref1}$ is one-sixth the highest voltage $V_{DD}$, $V_{cell1}$ is one-third $V_{DD}$, $V_{ref2}$ is one-half $V_{DD}$, $V_{cell2}$ is two-thirds $V_{DD}$, $V_{ref3}$ is five-sixths $V_{DD}$ and $V_{cell3}$ equals $V_{DD}$. Thus it may be seen that $V_{ref1}$ is midway between $V_{cell0}$ and $V_{cell1}$, $V_{ref2}$ is midway between $V_{cell0}$ and $V_{cell3}$ and $V_{ref3}$ is midway between $V_{cell2}$ and $V_{cell3}$.

FIG. 2 will be used to illustrate the basic concept of the invention. A sense amplifier 1 can be connected to a pair of conductors 3A and 3B which form a folded bitline. Another sense amplifier 5 can be connected to a pair of conductors 7A and 7B which form the remainder of the folded bitline. In practice conductor 7A is a continuation of conductor 3A, and conductor 7B is a continuation of conductor 3B. The bitline is shown split in half as shown by dotted line 9. In practice, however, any of the sub-bitline conductors may be connected to any others, e.g. via FET switches.

Capacitor 11 represents a cell on which charge is stored in one of four voltage levels. It is desired to read the level and output two binary bits representing the charge level stored on capacitor 11.

The detailed sequence will be described below. It should be noted that sub-bitline conductor 7A can be brought to $V_{ref2}$, which is one-half $V_{DD}$. The voltage on sub-bitline 3B resulting from the charge stored on cell capacitor 11 is then compared with the voltage on conductor 7A to determine whether it is above or below $V_{ref2}$.

If the voltage on conductor 3B is above $V_{ref2}$, then the continuous conductor 3A-7B is brought to $V_{ref3}$, Which is midway between the voltage level $V_{cell2}$ and $V_{cell3}$. If the voltage on conductor 3B is below $V_{ref2}$, then the voltage on continuous conductor 3A, 7B is brought to $V_{ref1}$, which is midway between the $V_{cell1}$ and $V_{cell0}$ voltages. The continuous conductor 3A, 7B is referred to herein as a reference line.

It may be seen, therefore, that the voltage on the reference line is either above or below one-half $V_{DD}$, i.e. $V_{ref2}$, and is established midway between the only two voltages Which conductor 3B can have, $V_{cell0}$ and $V_{cell1}$, or $V_{cell2}$ and $V_{cell3}$.

The voltage on sub-bitline 3B is then compared with the voltage on the reference line to determine whether it is above or below that voltage. If it is above that voltage the logic voltage must be either $V_{cell1}$ or $V_{cell3}$; whichever one it is, was established by the first determination of whether the voltage on conductor 3B was above or below the midway voltage $V_{ref2}$. Similarly if the voltage on conductor 3B is below the voltage on the reference line, the logic output represents either $V_{cell0}$ or $V_{cell2}$, and again whichever one it is, was previously determined by the original determination of whether the voltage on conductor 3B is below or above $V_{ref2}$. In practice, the voltage on conductor 3B could be compared again With $V_{ref2}$, which is on lead 7A, to select which of either of the two cell voltage possibilities should be selected.

The result is a two bit binary bit word representing which of the four charge levels is stored in capacitor 11.

FIG. 3 illustrates in more detail a sequence of the steps in the process. Consider first bitlines BL and BL*. These bitline references are not shown as such, but their connection points to a pair of sensor amplifiers 13 and 15 are shown referenced BL and BL*. Sense amplifier 13 is provided to sense bit 0 and sense amplifier 15 is provided to sense bit 1. It is important that bitlines should be able to be split exactly in half, e.g. by apparatus such as a switch into sub-bitline conductors BLA, BLB, BL*A and BL*B. The sense amplifiers can be enabled or disabled as required. Prior to step 1 all bitline segments are charged to the voltage $V_{ref2}$ which is ½ $V_{bb}$.

In step 1, sub-bitlines $BL_A$ and $BL_B$ are disconnected from the $V_{ref2}$ reference voltage, connected together and the sense amplifiers are not connected to the bitline. The cell capacitor 11 then dumps its charge onto the BL line formed of conductors $BL_A$ and $BL_B$, resulting in a voltage which for example is $$\frac{V_{DD}}{2}+\frac{C_s^*(V_{cell2}-V_{REF2})}{C_s+C_{BL}} \text{ i.e. } \frac{V_{DD}}{2}+\frac{C_s}{C_s+C_{BL}}+\frac{2V_{DD}}{3},$$

where $C_S$ is the cell capacitance and $C_{BL}$ is the capacitance of the entire bitline.

The voltage $V_{ref2}$ which is ½ $V_{DD}$ is applied to the BL* conductors $BL^*_A$ and $BL^*_B$.

In step 2, the two halves of the BL conductor are separated, and the bit 1 sense amplifier is connected to sense the voltage on conductor $BL_B$ to determine whether it is above or below the voltage $V_{ref2}$ which is on the $BL^*_B$ conductor. Since the voltage is $V_{cell2}$ which is above $V_{ref2}$, a logic level one signal is stored in dummy cell 17 which is connected to the $BL_B$ lead.

In step 3 the sense amplifier 15 and dummy cell 17 are disconnected from the bitline, and charge storage Ccell capacitor 18 is connected to lead $BL_B$. Conductors $BL_B$, $BL^*_B$, and $BL^*_A$ are all connected together, and the mid-point voltage $V_{ref2}$ is applied thereto.

In step 4 the logic level signal stored in dummy cell 17 is dumped to the sub-bitlines $BL_B$, $BL^*_B$ and $BL^*_A$. The charge is also shared with Ccell 18, which has one half the capacitance of a normal cell. This charge sharing on the three half bitlines plus Ccell creates the exact reference level needed for the 2nd phase of sensing.

The total capacity of the Ccell 18 should be established so that the resulting voltage on the sub-bitlines is, in this example, $V_{ref3}$. Thus for example if the voltage on the Ccell and sub-bitlines was established at $V_{ref2}$, one-half $V_{DD}$ in step 3, with the charge on dummy cell 17 having been established with full logic level $V_{DD}$ in step 2, when it is connected to the combined sub-bitlines in step 4, its charge, being shared with the Ccell, should result in a voltage $$\left(\frac{V_{DD}}{3}\right)\frac{C_s}{C_s+C_{BL}}+\frac{V_{DD}}{2}$$

i.e. $V_{ref3}$, which is midway between $V_{cell2}$ and $V_{cell3}$.

On the other hand, if in step 2 the sensed bit was a zero, charge on dummy cell 17 would have been zero or $V_{ss}$. When connected to the combined bitlines in step 4 it would receive charge from the Ccell 18, causing a reduction in voltage to $V_{ref1}$, which is midway between $V_{cell1}$ and $V_{cell0}$. Thus it may be seen that the combined sub-bitlines form a reference line, the voltage of which can be compared with that on cell 11, and corresponds to reference line 3A, 7B described with reference to FIG. 2.

In step 5 the Ccells 18 and dummy cell 17 are disconnected and each of the sub-bitlines are isolated. The voltage $V_{ref2}$ of one-half $V_{DD}$ is applied to the sub-bitline $BL^*_B$. It may be seen that the sub-bitline $BL^*_B$ is now at the midpoint $V_{ref2}$, both sub-bitlines $BL^*_A$ and $BL_B$ are at the reference line voltage $V_{ref3}$ (or $V_{ref1}$ if the original cell voltage had been below $V_{ref2}$), and the sub-bitline BLA is at the cell capacitor 11 voltage.

The sense amplifiers 13 and 15 are then connected to their respective associated sub-bitlines. Bit zero from sub-bitlines $BL^*_A$ and $BL_A$ is sensed in sense amplifier 13, and preferably bit 1 from sub-bitline $BL^*_B$ and $BL_B$ is resensed. The outputs of the sense amplifiers 13 and 15 form a two bit binary word (bit 0 and bit 1) representing the level originally stored on cell 11.

FIG. 4 illustrates in steps 7 and 8 a write or restore operation.

Either immediately after step 6, for the restore operation, or at the beginning of a write operation, the sub-bitlines are separated and the sense amplifiers are disabled. In the case of a restore operation, the logic levels are already present on the sub-bitline conductors. In the case of a write operation, binary bits are written to each of the sub-bitline conductors, or to as many as are required to determine the level of the bit to be stored. To restore $V_{cell0}$ or $V_{cell3}$ the full logic level is left in the cell. To restore $V_{cell1}$ or $V_{cell2}$ the full logic level must be attenuated by ⅓ as shown in the example step 8. In step 8, the required sub-bitlines $BL^*_A$, $BL_A$ and $BL_B$ shown are short-circuited together and the charge thereon is shared. This shared charge is written to cell capacitor 11 by connection of capacitor 11 thereto.

It should be noted that the concept described above has certain very significant advantages. For example no changes are required to either the currently used DRAM basic memory cell or to the DRAM manufacturing process.

Another advantage of this invention is that the first sensed step, i.e. step 2 of the read cycle described with reference to FIG. 3, can be simplified to appear identical to a standard one-bit-per-cell sense. If only the values 1,1 and 0,0 are stored in the cell, then the first sense has noise margins equal to $V_{DD}/2$, the same as a standard DRAM. Indeed, one step regenerative sensing is possible by allowing the sense amplifier to be enabled earlier in the operation and by not bothering to split the bitlines. Therefore if two bits per cell in the present design is not used, the memory wafers can still be used as standard one bit per cell structure. The resulting overhead to use the present invention is the extra sense amplifier, bitline splitting switches and cycle control logic. However the same design can be used for either one or two bits per cell application.

Reference is now made to FIGS. 5 and 6. In FIG. 5, a schematic diagram of an embodiment of the present invention is shown. The convention is used of the bitline conductors referenced in FIG. 4, that is $BL_A$, $BL^*_A$, $BL_B$ and $BL^*_B$. All of the transistors used in this embodiment are N channel field effect transistors (FETs). While steps 1-6 are described in detail, a person understanding the description below will be able to understand how the restore and write operations proceed without further explanation.

Conductors $BL_A$ and $BL_B$ and $BL^*_A$ and $BL^*_B$ are connected to respective source and drains of FET transistors 20 and 21 respectively, whose gates are driven by timing signals $CB_L$ and $CB_L$* respectively. Bitline conductor $BL_B$ is connected to a terminal of sense amplifier 22 via the source-drain circuit of FET transistor 23, while bitline conductor $BL_A$ is connected to sense amplifier 24 Via FET 25. Similarly bitline conductor $BL^*_B$ is connected to the other terminal of sense amplifier 22 via FET 26 and bitline conductor $BL^*_A$is connected to the other terminal of sense amplifier 24 via FET 27. FETs 23 and 26 are operated via a timing signal ISO2 which is applied to their gates, and FETs 25 and 27 are enabled by timing signal ISO1 applied to their gates.

Bitline precharge voltage $V_{BLP}$ is applied to bitlines $BL^*_A$ and $BL_A$ via FETs 28 and 29, and to bitline conductors $BL^*_B$ and $BL_B$ via FETs 30 and 31.

The charge to be sensed is stored on cell capacitor 32, which is connected to bitline $BL_A$ via FET 33, which is driven by the timing signal WL1 received from a word line applied to its gate.

In operation, initially the bitline portions are isolated from each other by the $C_{BL}$ and $C_{BL*}$ timing voltage being low rendering FETs 20 and 21 non-conductive, and precharge voltage is applied to the four bitline conductors via transistors 28, 29, 30 and 31 due to timing voltages $M_{A1}$, $M_{A1*}$, $M_{A2}$ and $M_{A2*}$ being high. At the same time the bitline conductor voltages are equalized via FETs 39 and 34 short-circuiting bitline conductor pairs $BL_A$ and $BL_{*A}$, and $BL_B$ and $BL_{*B}$ respectively, FET 39 being enabled by the $E_{Q1}$ timing voltage being applied to its gate, FET 34 being enabled by $E_{Q2}$.

Once precharge has been completed, the timing voltages $E_{Q1}$, $E_{Q2}$ and $M_{A1}$, $M_{A2}$ and $M_{A2*}$ go low, causing transistors 39, 34, 29, 31 and 30 to open. Timing voltage $M_{A1*}$ remains high, maintaining precharge voltage ($V_{ref2}$ in step 1 of FIG. 3) on bitline conductor $B_{L*A}$.

The next step is for the timing voltage $C_{BL}$ to go high for a short interval and at the same time for $W_{L1}$ to go high. This causes FET 20 to conduct, connecting bitline conductors $BL_A$ and $BL_B$ together, and at the same time transistor 33 conducts, causing the charge from bit storage capacitor 32 to be dumped to the bitline conductor $BL_A$. Since the timing voltages ISO1 and ISO2 are low, the transistors 25, 27, 23, and 26 are open, isolating the sense amplifiers 24 and 22 from the bitlines. The stage of step 1 in which the cell charge from capacitor 32 is dumped onto the bitline conductors $BL_A$ and $BL_B$ and that the remaining bitline conductors $BL^*_A$ and $BL_{*B}$ have been precharged to a midpoint reference voltage $V_{BLP}$ ($V_{ref2}$) has thus been completed.

Once the charge has been dumped onto the bitline, the $C_{BL}$ timing voltage returns to a low level, isolating the bitline conductors $BL_A$ and $BL_B$ and following this the ISO2 voltage goes high, enabling transistors 23 and 26. The timing voltages $V_{S2}$ and $V_{R2}$ flip, causing sense amplifier 22 to sense the bit stored on bitline conductor $B_{LB}$ relative to the midpoint reference voltage stored on bitline $B_{L*B}$. The full logic level value of the sensed bit (0 or 1) is then applied by sense amplifier 22 to the bitline. Timing voltage $W_{L2}$ going high enables FET 35, causing the sensed bit logic level voltage to be stored in dummy capacitor cell 36.

The timing voltage $W_{L2}$ then drops, isolating capacitor 36. The voltages $V_{S1}$ and $V_{S2}$ applied to sense amplifier 22 reverse, disabling sense amplifier 22. This completes step 2, wherein the bit has been sensed and stored in the dummy cell capacitor 36.

The timing voltage ISO2 then drops, causing transistors 22 and 26 to isolate the bitline conductors $BL_B$ and $BL_{*B}$ from sense amplifiers 22. The timing voltage EQ2, $M_{A2}$ and $M_{A2*}$ then go high, causing transistor 34 to conduct and short-circuiting bitline conductors $BL_B$ and $BL_{*B}$, and causing FETs 31 and 30 to conduct, allowing reference voltage $V_{BLP}$ ($V_{ref2}$) to be reapplied to the bitline conductors $BL_B$ and $BL_{*B}$. Then the timing voltage $C_{BL*}$ goes high, causing transistor 21 to conduct, joining bitline conductors $BL_{*A}$ with $BL_{*B}$ and $BL_B$. Accordingly the reference voltage $V_{BLP}$ is applied to those three bitline conductors, which are equalized. Ccell capacitor 37 is then connected to the bitline conductor $BL_B$ via FET 38 due to the gate of FET 38 going high with the timing voltage $V_{CL}$. This completes operation through to the completion of step 3 described with reference to FIG. 3.

The timing voltage $M_{A2}$ and $M_{A2*}$, as well as $M_{A1*}$ then go to low level, inhibiting FETs 31, 30 and 28, cutting off reference voltage $V_{BLP}$ from the bitline conductors.

The next step is for the timing voltage WL2 to go high. This causes the charge stored on dummy cell capacitor 36 to be dumped onto the three interconnected bitline conductors $BL_B$, $BL_{*B}$ and $BL_A$, and as well onto Ccell 37. This completes step 4 described with reference to FIG. 3.

The timing voltage EQ2 then drops to low level, removing the short circuit between the bitline conductors $BL_B$ and $BL_{*B}$, and the timing voltage $C_{BL*}$ drops to low level, causing separation of the bitline conductors $BL_{*A}$ and $BL_{*B}$. The four bitline conductors are thus mutually isolated.

The timing voltage $M_{A2*}$ then goes to high level for a short period, recharging the bitline conductor $B_{L*B}$ to the reference voltage $V_{BLP}$. The result, at this stage, is that the bitline conductor $B_{L*B}$ is at the voltage of reference level $V_{BLP}$, the bitline conductors $B_{L*A}$ and $BL_B$ are charged to the distributed level resulting from the charge previously stored on dummy capacitor 36, and the bitline conductor $B_{LA}$ is charged to the level stored on the bit storage cell capacitor 32. This completes step 5 described with reference to FIG. 3.

The timing voltages ISO1 and ISO2 then go to high level, enabling FETs 23 and 26, and 25 and 27, thus connecting sense amplifiers 22 and 24 to the bitlines. The timing voltages $V_{S1}$ and $V_{S2}$ and $V_{R1}$ and $V_{R2}$ are inverted, causing operation of sense amplifiers 22 and 24, thus sensing the bit stored on the two bitlines $BL_A$ and $BL_{*B}$ relative to the voltages (which are at the same voltage level) on bitline conductors $BL_{*A}$ and $BL_B$. This completes the operation of step 6 described with reference to FIG. 3.

The output result of sense amplifier 22 and 24 are thus two bits which describe the charge level stored in capacitor 32 to the accuracy of $2^2$=4 levels, as described above.

It should be noted that there are several ways of expanding the above invention so that more than four charge levels stored on bit storage capacitor 32 can be detected. One way is to use a variable reference voltage $V_{BLP}$, which is changed in the direction of the sensed bit level following either a first or successive sensing steps. A second way is to use more than the three voltage reference levels 1/6 $V_{DD}$, ½ $V_{DD}$, and 5/6 $V_{DD}$ described. The bitlines may be divided into three sections for three successive sensing operations to get 8 levels, 4 sections or 16 levels, etc. By successive sensing and charge juggling between the dummy capacitor and Ccell capacitors, first coarse and then finely tuned, voltage references can be established, following which the sensing of the charge in the memory cell can be effected as being either above or below the established voltage reference.

A person understanding this invention may now conceive of alternative structures and embodiments or variations of the above. All of those which fall within the scope of the claims appended hereto are considered to be part of the present invention.

I claim:

[1. A method of processing data having one of four voltage levels stored in a DRAM cell comprising:

(a) sensing whether or not the data voltage is above or below a voltage level midway between a highest and a lowest of said four levels, (b) setting the voltage on a reference line higher than the lowest and lower than the next highest of said four levels in the event the data voltage is below said midway voltage level, and setting the voltage on the reference line higher than the second highest and lower than the highest of said four levels in the event the data voltage is above said midway voltage level, and (c) sensing whether the data voltage is higher or lower than the reference line, whereby which of the four levels the data occupies is read.]

[2. A method as defined in claim 1 in which the voltage on the reference line is set at approximately one half the voltage difference between either of the lowest or highest voltage level and the adjacent one of the four voltage levels.]

[3. A method as defined in claim 1 in which said four levels are at 0, ⅓, ⅔ and 1 times a power supply voltage scaled by the cell to bitline capacitance ratio, and in which the voltage on the reference line in step (b) is set at either 1/6 or 5/6 the power supply voltage in step (b) scaled by the cell to bitline capacitance ratio.]

[4. A method as defined in claim 1 including charging a dummy capacitor to a level representing whether or not said data is above or below said midway voltage, and setting the voltage on the reference line by establishing a voltage level thereon which is midway between the highest and lowest of said four levels, then raising or lowering the voltage level thereon by dumping the charge from said dummy capacitor thereon.]

[5. A method of processing data having one of plural levels stored in a DRAM cell capacitor comprising:

(a) dumping the charge of the cell capacitor on a first conductor of a pair of conductors of a folded bitline, (b) maintaining the other conductor of said pair of conductors split into other sub-bitline conductors and charging each of said other sub-bitline conductors to an intermediate voltage, (c) splitting said first of said pair of conductors into first sub-bitline conductors, (d) sensing one of said sub-bitline conductors to determine whether the charge of said cell has a higher voltage than the intermediate voltage of one of said other sub-bitline conductors and providing a logic level result signal, (e) storing said logic level result signal in a dummy cell capacitor, (f) setting a charge storage capacitor and all of the sub-bitlines other than a first sub-bitline conductor on which the charges of cell capacitor was dumped, at to a predetermined voltage, (g) dumping charge stored in the dummy cell capacitor on said sub-bitlines conductors other than the first sub-bitline conductor to which the charge of the cell capacitor was dumped, and on said charge storage capacitor together, thereby varying the predetermined voltage stored thereon to a degree related to the capacities of said dummy cell capacitor, said charge storage capacitor and said predetermined voltage, to a level above or below the intermediate level, (h) isolating the sub-bitlines, (i) applying said intermediate voltage to one of said other sub-bitline conductors, (j) comparing the cell voltage on one sub-bitline with the voltage on said other sub-bitline carrying said level above or below the intermediate level to obtain a first logic bit, and comparing the voltages carried by the other sub-bitlines to obtain a second logic bit, whereby said first and second logic bits are indicative of one of four states corresponding to one of said plural levels stored in the DRAM cell.]

[6. A method as defined in claim 5 in which said intermediate and said predetermined voltages are the same.]

[7. A method as defined in claim 6 in which said intermediate and predetermined voltages are the same midpoint voltage between a highest and lowest voltage state representative of four logical states.]

[8. A method as defined in claim 7, including the further steps of short circuiting two or three of the sub-bitlines to share charge thereon and establish a common voltage level, and storing said shared charge corresponding to the common voltage level on said cell, whereby a restore or write operation results.]

[9. A method as defined in claim 7, including the further steps of writing logic voltage levels to each of the sub-bitline conductors, short circuiting two or three of the sub-bitlines to share charge thereon and establish a common voltage level, and storing said shared charge corresponding to the common voltage level on said cell, whereby a write operation results.]

*10. A multi-bit DRAM cell, comprising:*

*a cell capacitor in which one of a plurality of data voltage values is maintained;*

*means for precharging subbitlines of a pair of bitlines, the pair of bitlines being subdivided into a plurality of subbitlines;*

*a plurality of switches for interconnecting the subbitlines;*

*a plurality of sensing amplifiers, each sensing amplifier associated with and switchably connected to a pair of subbitlines;*

*means for dumping a stored charge onto a precharged subbitline of at least one pair of subbitlines to produce a sensing voltage; and*

*means for adjusting a reference voltage responsive to a last determined bit.*

*11. The multi-bit DRAM cell of claim 10, wherein the switches are FET switches.*

*12. The multi-bit DRAM cell of claim 11, wherein the means for adjusting the reference voltage comprises:*

*a dummy capacitor, in which a charge indicative of previously determined bits is stored; and*

*at least one second cell capacitor having a capacitance such that upon dumping the charge stored in the dummy capacitor into said at least one second cell capacitor, the adjusted reference voltage is established, said adjusted reference voltage being one of a plurality of predetermined reference voltage levels.*

*13. The multi-bit DRAM cell of claim 11, wherein the pair of bitlines is divided into a number of subbitlines, said number responsive to the number of data voltage values.*

*14. The multi-bit DRAM cell of claim 11, wherein the DRAM cell is capable of operating in either of two modes, a first mode being a one bit per cell DRAM, and a second mode being a multibit per cell DRAM.*

*15. A method for storing a multi-bit value in a DRAM cell, the method comprising:*

*storing a charge in a cell capacitor, the stored charge producing one of a plurality of data voltage values;*

*precharging subbitlines of a pair of bitlines to one of a plurality of predetermined reference voltage levels;*

*dumping the stored charge onto a precharged subbitline of at least one pair of subbitlines to produce a sensing voltage;*

*determining a bit of the multi-bit value by comparing the sensing voltage to a reference voltage;*

*for each additional bit,*

*adjusting the reference voltage responsive to a last determined bit; and*

*determining the additional bit by comparing the sensing voltage to the adjusted reference voltage.*

*16. The method of claim 15, wherein adjusting the reference voltage comprises:*

*storing a charge in a dummy capacitor, said charge being indicative of previously determined bits;*

*charging at least one second cell capacitor to the reference voltage; and*

*dumping the charge stored in the dummy capacitor onto a plurality of subbitlines, and sharing said charge with the at least one second cell capacitor, the at least one second cell capacitor having a capacitance such that the adjusted reference voltage is established, said adjusted reference voltage being one of the plurality of predetermined reference voltage levels.*

*17. The method of claim 15, wherein the pair of bitlines is divided into a number of subbitlines, said number responsive to the number of data voltage values.*

*18. The method of claim 15, wherein the DRAM cell is capable of operating in either of two modes, a first mode being a one bit per cell DRAM, and a second mode being a multibit per cell DRAM.*

*19. The method claim 15, wherein adjusting the reference voltage is in the direction of a last sensed bit.*

* * * * *